(12) United States Patent
Kamekawa

(10) Patent No.: US 6,268,616 B1
(45) Date of Patent: *Jul. 31, 2001

(54) ELECTRICAL WIRING BOARD AND METHOD FOR IDENTIFYING SAME

(75) Inventor: Eiichiro Kamekawa, Tokyo (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/639,323

(22) Filed: Apr. 25, 1996

(30) Foreign Application Priority Data

Apr. 26, 1995 (JP) .................................................. 7-102428

(51) Int. Cl.[7] ........................... H01L 23/58; H01L 23/48; H01L 23/52; H01L 29/40
(52) U.S. Cl. ............................. 257/48; 257/773; 257/786
(58) Field of Search ................................. 438/15, 16, 14; 257/48, 773, 786

(56) References Cited

U.S. PATENT DOCUMENTS

| | | | | |
|---|---|---|---|---|
| 4,028,728 | * | 6/1977 | Sharp | 358/100 |
| 4,720,915 | * | 1/1988 | Kennedy et al. | |
| 4,959,750 | * | 9/1990 | Cnyrim et al. | 361/401 |
| 5,267,217 | * | 11/1993 | Tokura et al. | |
| 5,495,424 | * | 2/1996 | Tokura | 364/507 |
| 5,528,461 | * | 6/1996 | Gore et al. | |
| 5,630,270 | * | 5/1997 | O'Malley | |

* cited by examiner

Primary Examiner—David E. Graybill
(74) Attorney, Agent, or Firm—Pillsbury Winthrop LLP

(57) ABSTRACT

An electrical wiring boards 10 having the same specifications are provided with a plurality of lands for identification 12a to 12e and identification of the type of the final product is carried out by applying solder onto one land for identification 12b corresponding to the final product.

8 Claims, 4 Drawing Sheets

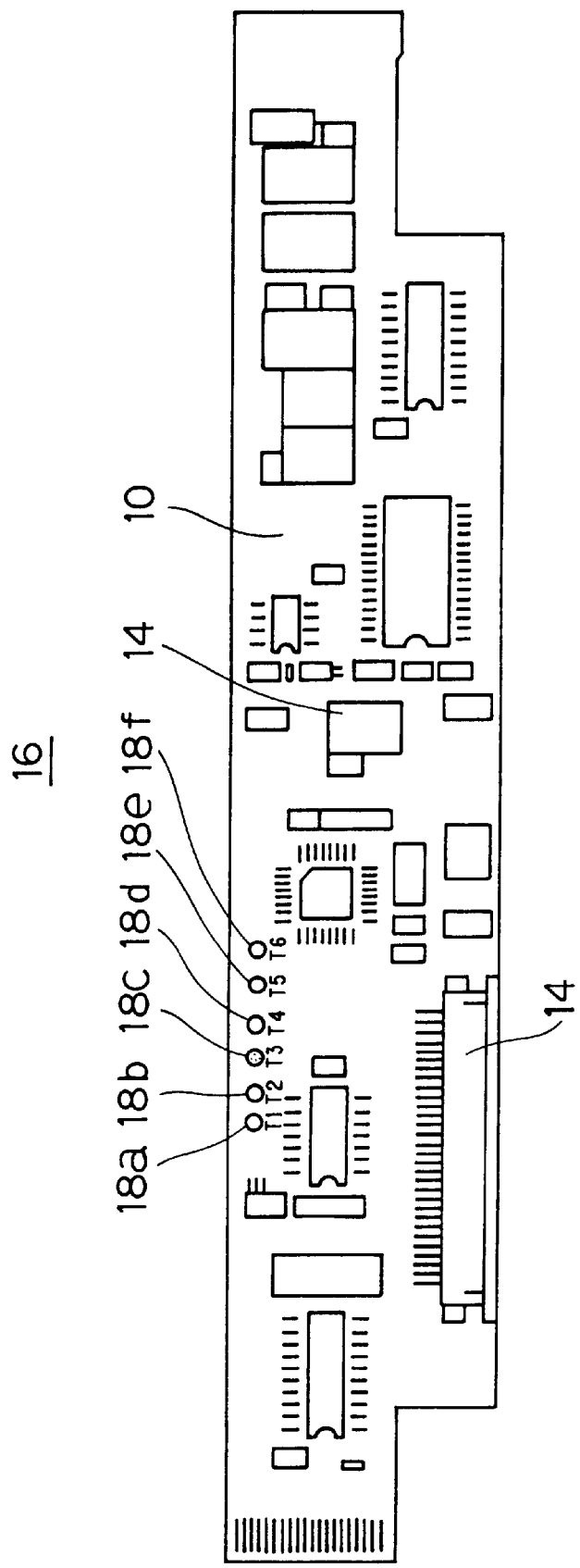

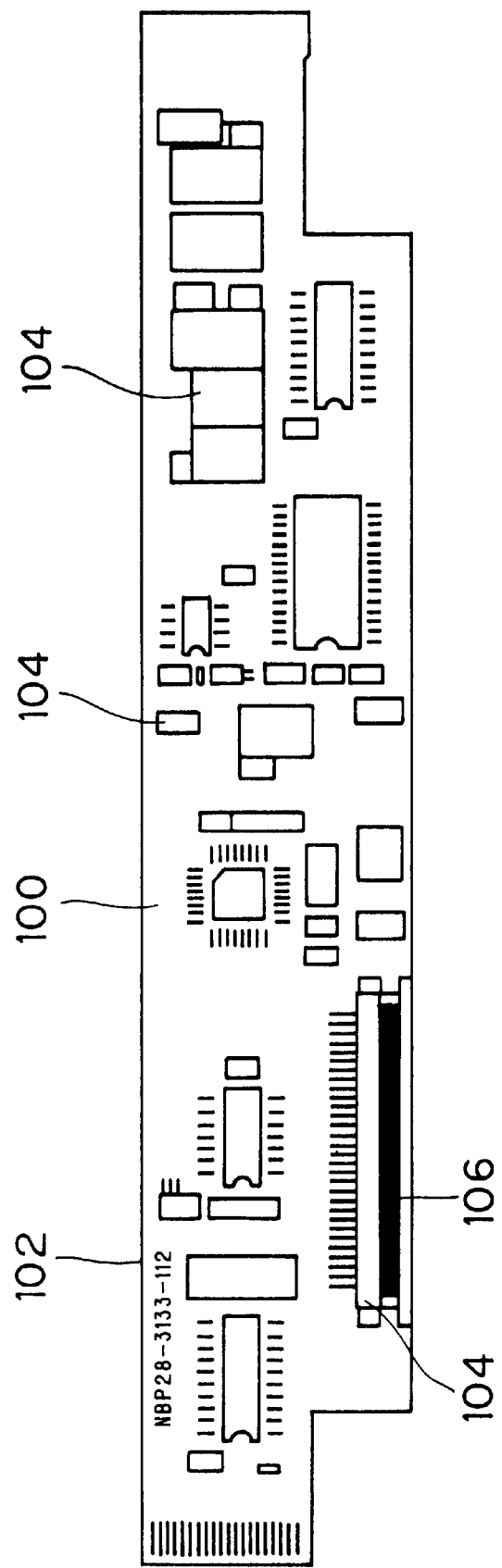
FIG.4 *Prior Art*

ELECTRICAL WIRING BOARD AND METHOD FOR IDENTIFYING SAME

TECHNOLOGICAL FIELD

This invention relates to an electrical wiring board used in electronic products and a method for identifying the same.

RELATED ART

Conventionally, electrical wiring boards and completed printed circuit boards comprising of electrical wiring boards with electronic components mounted thereon have been manufactured in correspondence with individual final products in which they are to be used. However, in recent years, to promote standardization and common use of parts, redundancy design of electrical wiring boards has been being carried out and electrical wiring boards having the same specification have been being used to make a plurality of different completed printed circuit boards by mounting different components on them. For example, in the case of completed printed circuit boards used for liquid crystal display devices, making just the type of signal inputted into the liquid crystal display device different, making just whether or not there is a buffer in a wave test different or making just connectors different have been tried.

OBJECT OF THE INVENTION

However, when electrical wiring boards having the same specifications have been used with different components mounted thereon as a plurality of different completed printed circuit boards, because the electrical wiring boards have the same specifications they look almost the same and it has been difficult for assembly workers to identify which final product a completed printed circuit board is for.

That is, when the electrical wiring boards of different completed printed circuit boards have the same specifications it is almost impossible to distinguish them by their outline shape or size and consequently the only way of identifying the completed printed circuit boards has been by differences in the components mounted on the electrical wiring boards. However, because these mounted components are extremely small, the probability of making an incorrect identification has been high.

Because of this, conventionally, as a method for identifying completed printed circuit boards, as shown in FIG. 4, a product name (in the case shown in FIG. 4, 'NBP28-3133-112') has been displayed on the surface of an electrical wiring board 100 with silk screen printing 102. As for other methods, for example marking 106 with black ink of a mounted component 104 such as a connector has been carrier out or silk screen printing on a mounted component 104 in a color such as white or yellow has been carried out to identify the product by this color.

However, printing a product name in silk screen print 102 is troublesome and costly. Also, when marking 106 has been carried out on a mounted component 104 it has sometimes happened that this marking has disappeared in the course of the manufacturing process of the product. Furthermore, in the case of identification by changing the color of silk screen printing, because the specifications of the electrical wiring board increase there have been problems such as that to control completed printed circuit boards to high quality is not possible and that manufacturing costs increase.

In this connection, in view of the problem points mentioned above, an object of the present invention is to provide an electrical wiring board and method of identifying the same with which even when a plurality of different completed printed circuit boards are assembled from electrical wiring boards having the same specifications it is possible to identify the type of a completed printed circuit board easily.

SUMMARY OF THE INVENTION

A first aspect of the invention provides an electrical wiring board capable of using for a plurality of different completed printed circuit boards comprising a connecting conductor pattern disposed on a board for making possible connections between components, which comprises a plurality of lands being disposed on a surface of the electrical wiring board for identifying the specification of the completed printed circuit boards.

An electrical wiring board according to this first aspect of the invention is provided with a plurality of lands for identification respectively corresponding to each of a plurality of completed printed circuit boards. By applying an adhesive to one land for identification among these lands for identification which corresponds to the final product in which the completed printed circuit board is to be used, the type of the completed printed circuit board can be identified easily.

A second aspect of the invention provides an electrical wiring board according to claim 1, further comprising a solder selectively disposed onto at least one of the lands, corresponding to said specification.

A third aspect of the invention provides an electrical wiring board according to the first aspect of the invention wherein the lands for identification are electrically connected to the connecting conductor pattern so that they can be used for inspection of the electrical wiring board.

With an electrical wiring board according to this third aspect, because the lands for identification are electrically connected to the connecting conductor pattern making inspection possible, it is not necessary to provide special lands for identification.

A fourth aspect of the invention provides an electrical wiring board according to the first aspect wherein the plurality of lands for identification are arrayed in a line.

With an electrical wiring board according to the fourth aspect of the invention, because the lands for identification are arrayed in a line, identification is easy.

A fifth aspect of the invention provides an electrical wiring board made from glass cloth, paper board, epoxy resin or coppered laminated sheet on which components can be mounted to make any of a plurality of different completed printed circuit boards, comprising a plurality of lands for identification respectively corresponding to each of the plurality of completed printed circuit boards.

An electrical wiring board according to the fifth aspect of the invention is provided with a plurality of lands for identification respectively corresponding to each of a plurality of completed printed circuit boards. By applying solder to one land for identification among these lands for identification which corresponds to the final product in which the completed printed circuit board is to be used, the type of the completed printed circuit board can be identified easily.

A sixth aspect of the invention provides an electrical wiring board according to the fifth aspect of the invention wherein the lands for identification also serve as pads for testing.

With an electrical wiring board according to the sixth aspect of the invention, by using the lands for identification as pads for testing, it is not necessary to provide special lands for identification.

A seventh aspect of the invention provides an electrical wiring board according to the fifth aspect of the invention wherein the plurality of lands for identification are arrayed in a line.

With an electrical wiring board according to the seventh aspect of the invention, because the lands for identification are arrayed in a line, identification is easy.

An eighth aspect of the invention provides a method for manufacturing completed printed circuit boards having a plurality of specification using electrical wiring boards having one specification, wherein each electrical wiring board includes a plurality of lands, and solder is applied onto at least one of the land corresponding to each specification of the completed printed circuit board, wherein the completed printed circuit boards of one of the specification are distinguishable from the other by the presence or absence of the solder on each of the lands.

A ninth aspect of the invention provides a method for manufacturing completed printed circuit boards according to claim 8, wherein the lands also serve as pads for testing the electrical wiring boards.

A tenth aspect of the invention provides a method for manufacturing completed printed circuit boards according to claim 8, wherein the lands also serve as pads for testing the completed printed circuit boards.

Because with an electrical wiring board and method for identifying the same according to the invention electrical wiring boards having the same specifications are provided with lands for identification and the type of the final product is identified by applying an adhesive or solder to one land for identification corresponding to the final product in which the electrical wiring board is to be used, the type of the final product can be identified easily, the manufacturing cost does not increase and the number of manufacturing steps does not increase.

Also, by using the lands for identification as pads for testing or inspection, it is possible to reduce manufacturing cost.

BRIEF DESCRIPTION OF THE DRAWINGS

FIG. 3 is a plan view of a completed printed circuit board of a second preferred embodiment of the invention; and FIG. 4 is a plan view of a conventional completed printed circuit board.

DETAILED DESCRIPTION OF THE PREFERRED EMBODIMENTS

First Preferred Embodiment

Figure 1:
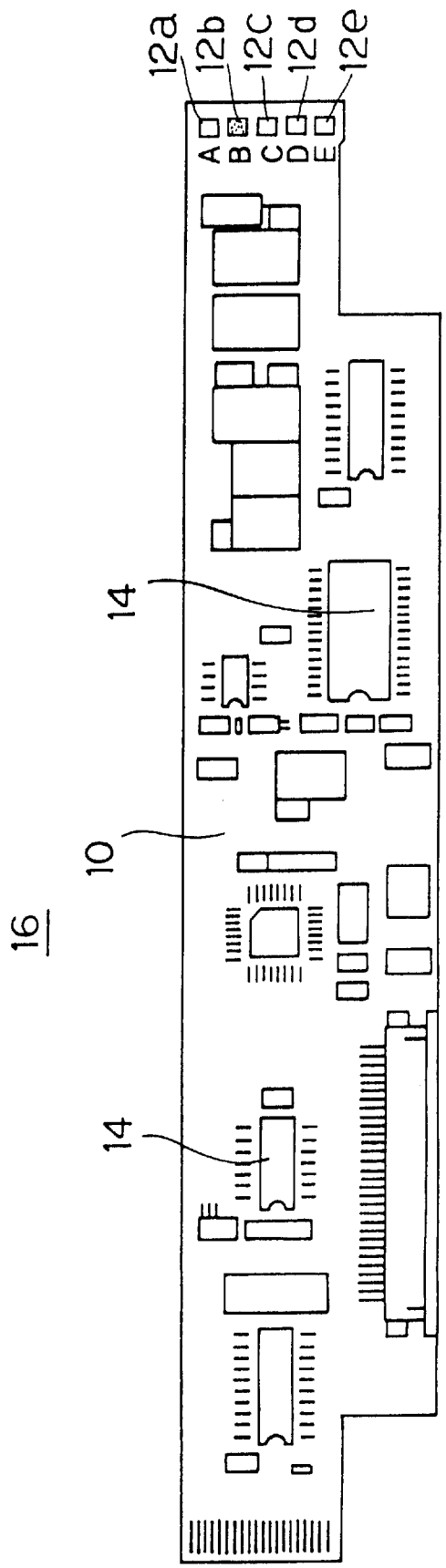
FIG. 1 is a plan view of a completed printed circuit board of a first preferred embodiment of the invention.
Figure 2:
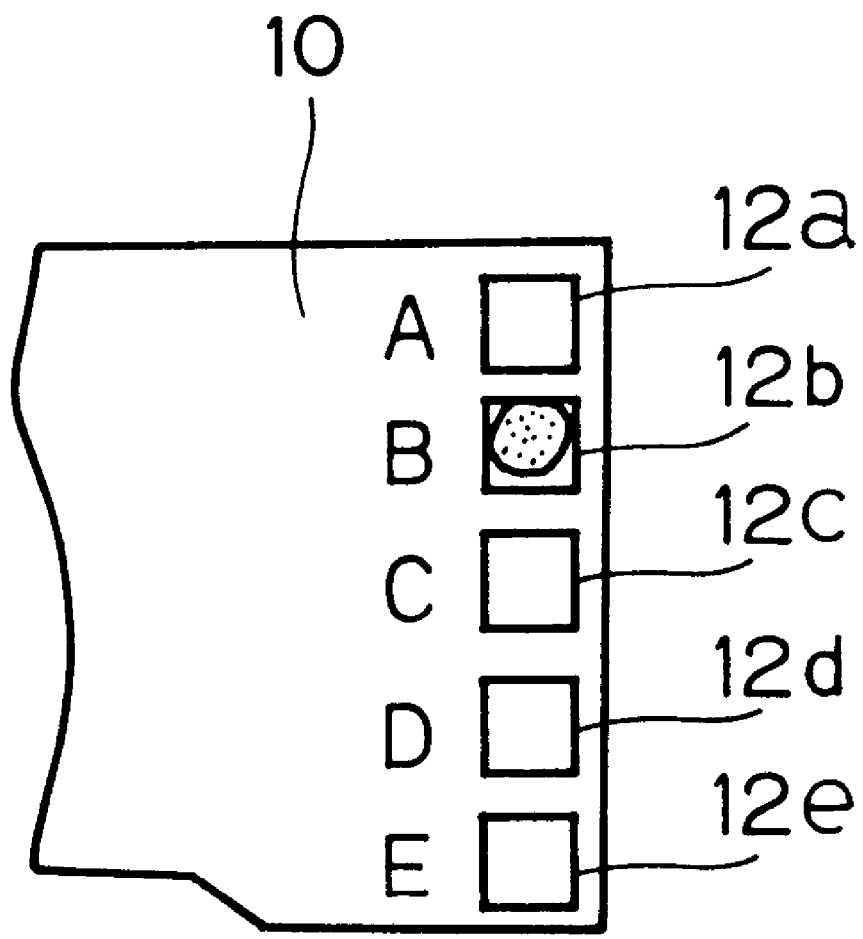
FIG. 2 is an enlarged plan view of a main part of the completed printed circuit board shown in FIG. 1.

A first preferred embodiment of the invention will now be described with reference to FIG. 1 and FIG. 2.

The electrical wiring board 10 of this preferred embodiment is made by a plurality of epoxy resin substrate having a thin copper pattern and each substrate being stacked, so that it is possible to assemble five different completed printed circuit boards A, B, C, D and E by mounting different components on electrical wiring boards 10 having the same specifications.

Five lands for identification 12a and 12e are provided on the surface of electrical wiring board 10 near the right hand end thereof. The marks A to E or identification codes of the final product, which are final product names, are printed beside the lands for identification 12a and 12e. A 'land' is a part of a conductor pattern used for connection or mounting of a component.

Using a mask pattern corresponding to the completed printed circuit board 16, solder is printed onto mounting sites for components on the electrical wiring board 10 made of a plurality of epoxy resin substrate. At the same time, by use of the same mask pattern, solder is printed onto the land for identification 12b corresponding to the final product in which the electrical wiring board is to be used. The components 14 are then disposed on the electrical wiring board 10 and the solder is reflowed to produce a completed printed circuit board 16. (See FIG. 2.)

As a result, when visually distinguishing the type of the completed printed circuit board 16 which is the final product, it is possible to identify the completed printed circuit board 16 easily by which of the lands for identification 12a to 12e has been presoldered. That is, in the case of this preferred embodiment, the completed printed circuit board is identified as being for final product B (see FIG. 1, FIG. 2). Also, because the final product names A to E are printed beside the lands for identification 12a to 12e, it is possible to identify the final product easily.

When manufacturing another type of completed printed circuit board 16 from the same electrical wiring board 10, if solder is supplied onto at least on of the land for identification corresponding to the type of that completed printed circuit board 16 using another mask pattern corresponding to the completed printed circuit board 16, it is easy to identify the completed printed circuit board 16 by distinguishing the position of the solder on the lands.

Also, because in this case electrical wiring boards 10 having the same specifications are used and solder is positioned onto the land for identification at the same time as printing the solder for electrically connecting the components 14 to electrical wiring board 10, the manufacturing cost does not increase and the number of working steps is not increased.

Second Preferred Embodiment

FIG. 3 shows an electrical wiring board 10 of a second preferred embodiment of the invention wherein the lands for identification also serve as pads for testing 18a and 18f and are electrically connected to the thin copper pattern.

In this case, after the components 14 are mounted on the electrical wiring board 10 these pads for testing 18a to 18f can be used to carry out testing of the product, for example continuity and voltage level testing. Furthermore, as in the first preferred embodiment described above, it is possible to identify the product by the presence or absence of solder.

In the case of this second preferred embodiment, because the lands for identification also serve as pads for testing 18a to 18f, it is not necessary to provide special lands for identification and consequently the component mounting efficiency can be kept high and manufacturing costs can be reduced.

What is claimed is:

1. A completed printed circuit board, comprising:
    a substrate including wiring patterns suitable for plural specifications, the substrate being made from glass cloth, paper board, epoxy resin or coppered laminated sheet;
    electrical components mounted on the substrate;
    a plurality of identifying lands free from mounting an electrical component; and solder applied on at least one of the identifying lands so as to form a visual pattern such that one or more of the identifying lands each have a visual deposit of solder thereon and such that one or more of the remaining identifying lands do not have a visual deposit of solder thereon, which visual pattern indicates a resulting specification of the completed circuit board.

2. A completed printed circuit board according to claim 1, wherein the plurality of identifying lands are arrayed in a line.

3. A completed printed circuit board according to claim 1, wherein each of the plurality of identifying lands is accompanied by a mark disposed nearby and the visual pattern includes the marks.

4. A completed printed circuit board according to claim 1, wherein the identifying lands function as testing pads for the completed printed circuit board.

5. A completed printed circuit board comprising:
 a substrate made from glass cloth or paper board impregnated with epoxy resin, or laminated sheet thereof and having wiring patterns thereon,
 electrical components mounted on the substrate and electrically connected with the wiring patterns through solder,
 a plurality of identification lands having a surface free from any mounted components, and
 a visual deposit of solder disposed on at least one of the plurality of identification lands so that one or more of the identification lands each have the visual deposit of solder thereon and one or more of the remaining identification lands do not have a visual deposit of solder thereon, thereby forming a visual pattern identifying a resulting specification of the completed printed circuit board.

6. A completed printed circuit board according to claim 5, wherein a plurality of identifying lands are arrayed in a line.

7. A completed printed circuit board according to claim 5, wherein each of the plurality of identifying lands is accompanied by a mark disposed nearby, and the visual pattern includes the marks.

8. A completed printed circuit board according to claim 5, wherein the identifying lands function as testing pads for the completed printed circuit board.

* * * * *